(12) United States Patent
Holloway et al.

(10) Patent No.: US 11,435,386 B2
(45) Date of Patent: Sep. 6, 2022

(54) SI-TRACEABLE RYDBERG ATOM RADIOFREQUENCY POWER METER AND DETERMINING POWER OF RADIO FREQUENCY RADIATION

(71) Applicant: Government of the United States of America, as represented by the Secretary of Commerce, Gaithersburg, MD (US)

(72) Inventors: Christopher Lee Holloway, Boulder, CO (US); Joshua Ari Gordon, Lafayette, CO (US); Matthew Thomas Simons, Lafayette, CO (US); Thomas Crowley, Madison, WI (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 250 days.

(21) Appl. No.: 16/818,330

(22) Filed: Mar. 13, 2020

(65) Prior Publication Data
US 2020/0292606 A1    Sep. 17, 2020

Related U.S. Application Data

(60) Provisional application No. 62/819,232, filed on Mar. 15, 2019.

(51) Int. Cl.
*G01R 29/08* (2006.01)
(52) U.S. Cl.
CPC ..... *G01R 29/0885* (2013.01); *G01R 29/0892* (2013.01)

(58) Field of Classification Search
CPC . G01R 29/0885; G01R 29/0892; G01R 21/01
(Continued)

(56) References Cited

U.S. PATENT DOCUMENTS 10,509,065 B1 * 12/2019 Shaffer .............. G01R 29/0885
10,564,201 B1 *  2/2020 Shaffer .................. G01R 33/26
(Continued)

OTHER PUBLICATIONS

Fan, Haoquan, et al. "Effect of vapor-cell geometry on Rydberg-atom-based measurements of radio-frequency electric fields." Physical Review Applied 4.4 (2015): 044015. (Year: 2015).*
(Continued)

*Primary Examiner* — Christopher P McAndrew
(74) *Attorney, Agent, or Firm* — Office of Chief Counsel for National Institute of Standards and Technology (57) ABSTRACT

A SI-traceable Rydberg atom radiofrequency power meter determines power of reference radiofrequency radiation and includes: a reference radiofrequency source that provides reference radiofrequency radiation; a vapor cell including: a pair of parallel-plate waveguides; a vapor cell wall including parallel opposing faces of the parallel-plate waveguides; and the vapor space physically bounded by the vapor cell wall to contain gas atoms in an optical overlap volume; and a transmission detector that receives the output light from the vapor cell and produces a transmission signal from the transmission detector for determination of power of the reference radiofrequency radiation, wherein the SI-traceable Rydberg atom radiofrequency power meter determines power of the reference radiofrequency radiation by electromagnetically induced transparency of the gas atoms in a Rydberg electronic state, the determination of power being traceable to the International System of Units (SI).

14 Claims, 10 Drawing Sheets

(58) Field of Classification Search
USPC .......................................................... 324/96
See application file for complete search history.

(56) References Cited

U.S. PATENT DOCUMENTS

2016/0363617 A1    12/2016  Anderson et al.
2019/0187198 A1*   6/2019   Anderson .......... G01R 29/0878

OTHER PUBLICATIONS

Anderson, D.A., et al., "A vapor-cell atomic sensor for radio-frequency field detection using a polarization-selective field enhancement resonator", Applied Physics Letters, 2018, p. 073501, vol. 113.
Simons, M.T., et al., "Electromagnetically Induced Transparency (EIT) and Autler-Townes (AT) splitting in the presence of band-limited white Gaussian noise" Journal of Applied Physics, 2018, p. 203105, vol. 123.

* cited by examiner

SI-TRACEABLE RYDBERG ATOM RADIOFREQUENCY POWER METER AND DETERMINING POWER OF RADIO FREQUENCY RADIATION

CROSS REFERENCE TO RELATED APPLICATIONS

The application claims priority to U.S. Provisional Patent Application Ser. No. 62/819,232 filed Mar. 15, 2019, the disclosures of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301)-975-2573; email tpo@nist.gov.

BRIEF DESCRIPTION

Disclosed is an SI-traceable Rydberg atom radiofrequency power meter for determining power of reference radiofrequency radiation comprising: a reference radiofrequency source that provides reference radiofrequency radiation; a vapor cell comprising: a pair of parallel-plate waveguides, the parallel-plate waveguides opposing one another and spaced by apart a vapor space such that the parallel-plate waveguides are parallel to each other for propagation of the reference radiofrequency radiation through the vapor space; a vapor cell wall comprising parallel opposing faces of the parallel-plate waveguides; and the vapor space physically bounded by the vapor cell wall to contain gas atoms in an optical overlap volume, such that the vapor cell: receives gas atoms in the vapor space; receives the reference radiofrequency radiation, such that the gas atoms are subjected to the reference radiofrequency radiation; and produces output light by the gas atoms in response to subjecting the gas atoms to the reference radiofrequency radiation, probe light, and coupling light; and a transmission detector that receives the output light from the vapor cell and produces a transmission signal from the transmission detector for determination of power of the reference radiofrequency radiation, wherein the SI-traceable Rydberg atom radiofrequency power meter determines power of the reference radiofrequency radiation by electromagnetically induced transparency of the gas atoms in a Rydberg electronic state, the determination of power being traceable to the International System of Units (SI).

Disclosed is a process for determining power of reference radiofrequency radiation with the SI-traceable Rydberg atom radiofrequency power meter, the process comprising: disposing gas atoms in the vapor space; receiving, by the vapor cell, the reference radiofrequency radiation; exciting the gas atoms to a Rydberg electronic state; subjecting the gas atoms in the Rydberg electronic state to the reference radiofrequency radiation; producing output light by the gas atoms in response to being subjected to the reference radiofrequency radiation while in the Rydberg electronic state; receiving, by the transmission detector, the output light from the vapor cell; producing, by the transmission detector, the transmission signal; and determining power of the modulated carrier radiation from the transmission signal, such that the determination of power is traceable to the SI.

BRIEF DESCRIPTION OF THE DRAWINGS

The following description cannot be considered limiting in any way. With reference to the accompanying drawings, like elements are numbered alike.

DETAILED DESCRIPTION

A detailed description of one or more embodiments is presented herein by way of exemplification and not limitation.

It has been discovered that an SI-traceable Rydberg atom radiofrequency power meter herein determines radio-frequency (RF) power using electromagnetically induced transparency (EIT) in gas atoms that can be in a Rydberg electronic state. This is accomplished, e.g., by disposing gas atoms such as an alkali atomic vapor in a waveguide and measuring the electric (E) field strength that occurs during EIT and Autler-Townes splitting for a reference radiofrequency radiation propagating in the waveguide. RF power carried by the reference radiofrequency radiation relates to the measured E-field and provides a direct International System of Units (SI) measurement of RF power. Advantageously, the SI-traceable Rydberg atom radiofrequency power meter provides quantum-based RF power measurement and RF power calibration via a direct link to the SI.

Conventional methods of measuring power is an indirect traceability path through a thermal measurement by a calorimeter in which a temperature rise created by absorbed microwave energy is compared to a DC electrical power used to create an identical temperature change. Conventional methods and hardware are limited because they obtain calibrated power measurements for frequencies below 110 GHz. The SI-traceable Rydberg atom radiofrequency power meter overcomes this technical limitation of conventional methods and hardware.

As used herein, "SI" refers to the International System of Units.

SI-traceable Rydberg atom radiofrequency power meter 200 determines a power of reference radiofrequency radiation 202. In an embodiment, with reference to FIG. 1, FIG. 2, FIG. 3, and FIG. 5, SI-traceable Rydberg atom radiofrequency power meter 200 includes: reference radiofrequency source 201 that provides reference radiofrequency radiation 202; and vapor cell 203 in communication with reference radiofrequency source 201. Vapor cell 203 includes a pair of parallel-plate waveguides 238, wherein parallel-plate waveguides 238 oppose one another and are spaced by apart vapor space 205 such that parallel-plate waveguides 238 are parallel to each other for propagation of reference radiofrequency radiation 202 through vapor space 205; vapor cell wall 204 including parallel opposing faces of parallel-plate waveguides 238; and vapor space 205 physically bounded by vapor cell wall 204 to contain gas atoms 206 in optical overlap volume 216. Vapor cell 203 receives gas atoms 206 in vapor space 205; receives reference radiofrequency radiation 202, such that gas atoms 206 are subjected to reference radiofrequency radiation 202; and produces output light 209 by gas atoms 206 in response to subjecting gas atoms 206 to reference radiofrequency radiation 202, probe light 213, and coupling light 215. SI-traceable Rydberg atom radiofrequency power meter 200 also includes transmission detector 210 that receives output light 209 from vapor cell 203 and produces transmission signal 211 from transmission detector 210 for determination of power of reference radiofrequency radiation 202. SI-traceable Rydberg atom radiofrequency power meter 200 determines power of reference radiofrequency radiation 202 by electromagnetically induced transparency of gas atoms 206 in Rydberg electronic state 233, and the determination of power by SI-traceable Rydberg atom radiofrequency power meter 200 is traceable to the International System of Units (SI).

In an embodiment, SI-traceable Rydberg atom radiofrequency power meter 200 of claim 1 also includes: probe laser 212 that produces probe light 213 that includes probe frequency that is resonant with probe electronic transition 229 of gas atoms 206; and coupling laser 214 that produces coupling light 215 that includes coupling frequency that is resonant with Rydberg electronic transition 232 of gas atoms 206. Vapor cell 203 further receives probe light 213 from probe laser 212, coupling light 215 from coupling laser 214, and reference radiofrequency radiation 202; subjects gas atoms 206 to probe light 213 such that gas atoms 206 undergo probe electronic transition 229 from first electronic state 230 to intermediate excited electronic state 231 in response to receiving probe light 213; subjects gas atoms 206 in intermediate excited electronic state 231 to coupling light 215 such that gas atoms 206 in intermediate excited electronic state 231 undergo Rydberg electronic transition 232 from intermediate excited electronic state 231 to Rydberg electronic state 233 in response to receiving coupling light 215; and subjects gas atoms 206 in Rydberg electronic state 233 to reference radiofrequency radiation 202 such that gas atoms 206 in Rydberg electronic state 233 undergo radiofrequency Rydberg transition 234 from Rydberg electronic state 233 to final Rydberg electronic state 235 in response to receiving reference radiofrequency radiation 202.

In an embodiment, SI-traceable Rydberg atom radiofrequency power meter 200 further includes antenna 217 in communication with reference radiofrequency source 201 that receives reference radiofrequency signal 218 from reference radiofrequency source 201 and produces reference radiofrequency radiation 202 from reference radiofrequency signal 218. Here, gas atoms 206 receive reference radiofrequency radiation 202 from antenna 217.

In an embodiment SI-traceable Rydberg atom radiofrequency power meter 200 further includes position manipulation stage 220 on which antenna 217 is disposed and that moves antenna 217 along movement direction 221 relative to vapor cell 203 to change a pathlength between antenna 217 and vapor cell 203 through which reference radiofrequency radiation 202 propagates.

In an embodiment, SI-traceable Rydberg atom radiofrequency power meter 200 further includes radiofrequency tuner 245 disposed on vapor cell 203 in radiocommunication with parallel-plate waveguides 238 and that receives and tunes reference radiofrequency radiation 202.

In an embodiment, SI-traceable Rydberg atom radiofrequency power meter 200 further includes power meter 244 disposed in radiocommunication with parallel-plate waveguides 238 and that receives tunes reference radiofrequency radiation 202 after propagating through vapor cell 203.

In an embodiment, SI-traceable Rydberg atom radiofrequency power meter 200 further includes directional coupler 242 disposed on vapor cell 203 in radiocommunication with parallel-plate waveguides 238 and that receives reference radiofrequency radiation 202 couples reference radiofrequency radiation 202 with parallel-plate waveguides 238.

In an embodiment, SI-traceable Rydberg atom radiofrequency power meter 200 further includes input coupler 243 disposed on vapor cell 203 in radiocommunication with parallel-plate waveguides 238 and that receives reference radiofrequency radiation 202 and communicates reference radiofrequency radiation 202 to vapor cell 203.

In an embodiment, vapor cell 203 further includes gas tube 240 in fluid communication with vapor space 205 and that communicates gas atoms 206 to the vapor space 205; and filling stem 239 in fluid communication with vapor space 205 and gas tube 240 and that communicates gas atoms 206 to vapor space 205 through gas tube 240 and contains alkali metal for production of gas atoms 206 from the alkali metal.

In an embodiment, vapor cell 203 further includes optical window 241 in fluid communication with vapor space 205 and that communicates probe light 213 and coupling light 215 to vapor space 205.

Figure 1:
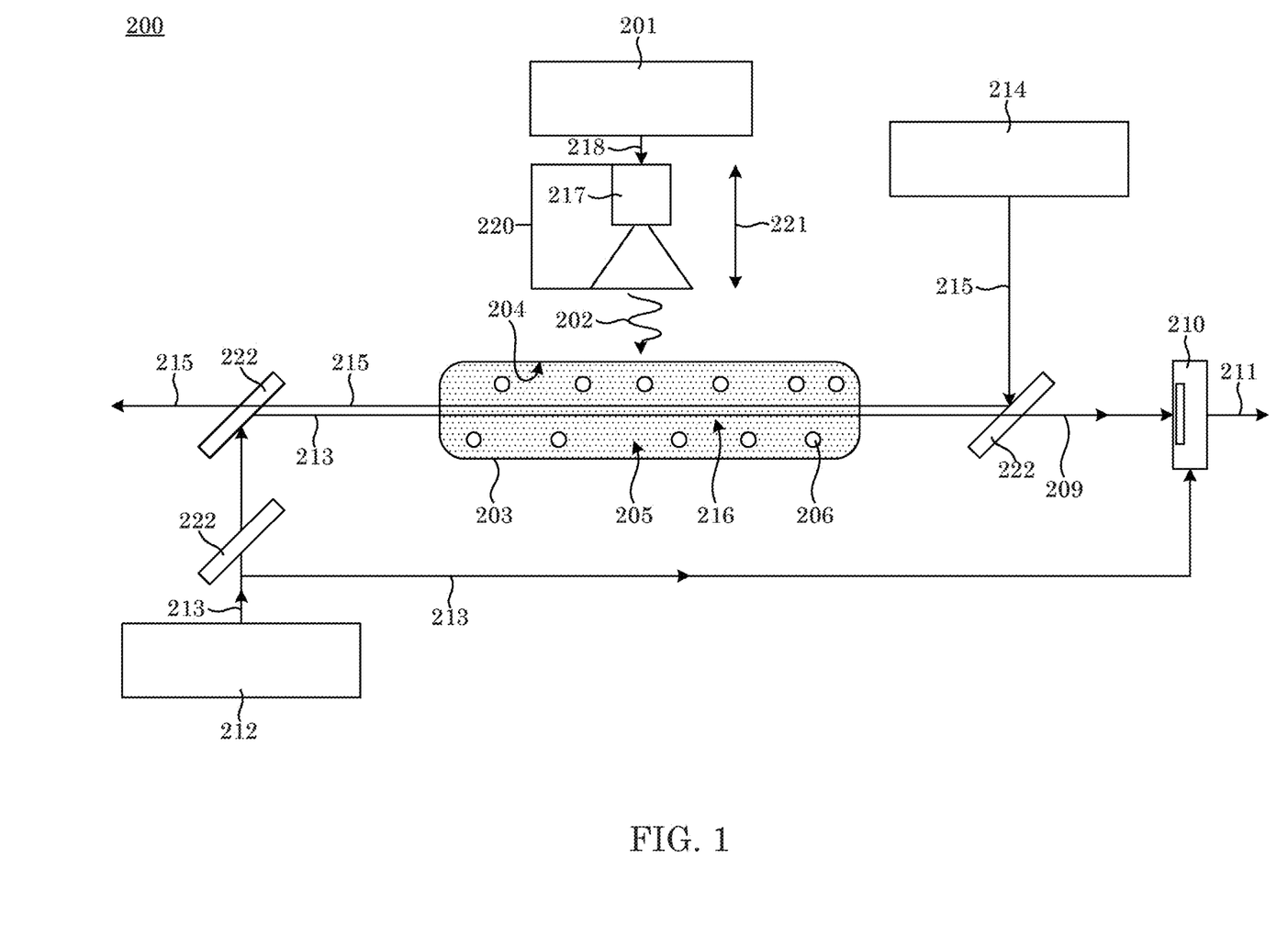
FIG. 1 shows a SI-traceable Rydberg atom radiofrequency power meter.
Figure 2:
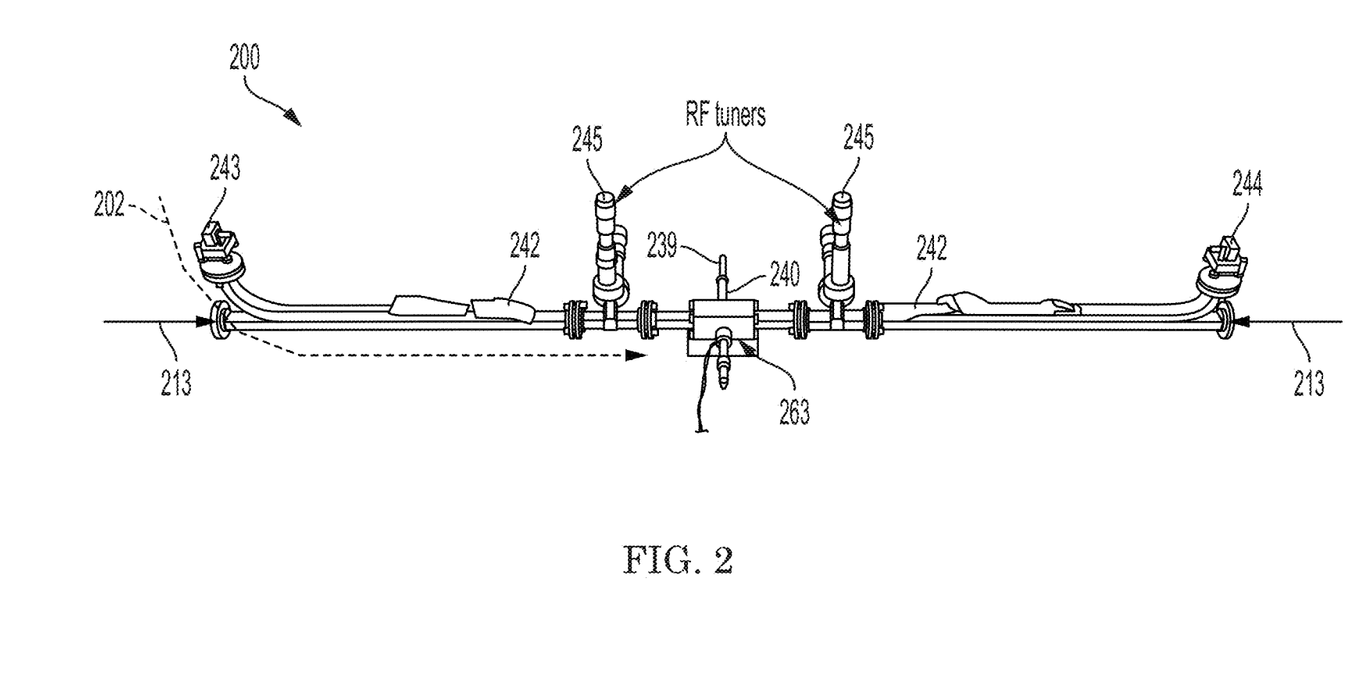
FIG. 2 shows a SI-traceable Rydberg atom radiofrequency power meter.
Figure 3:
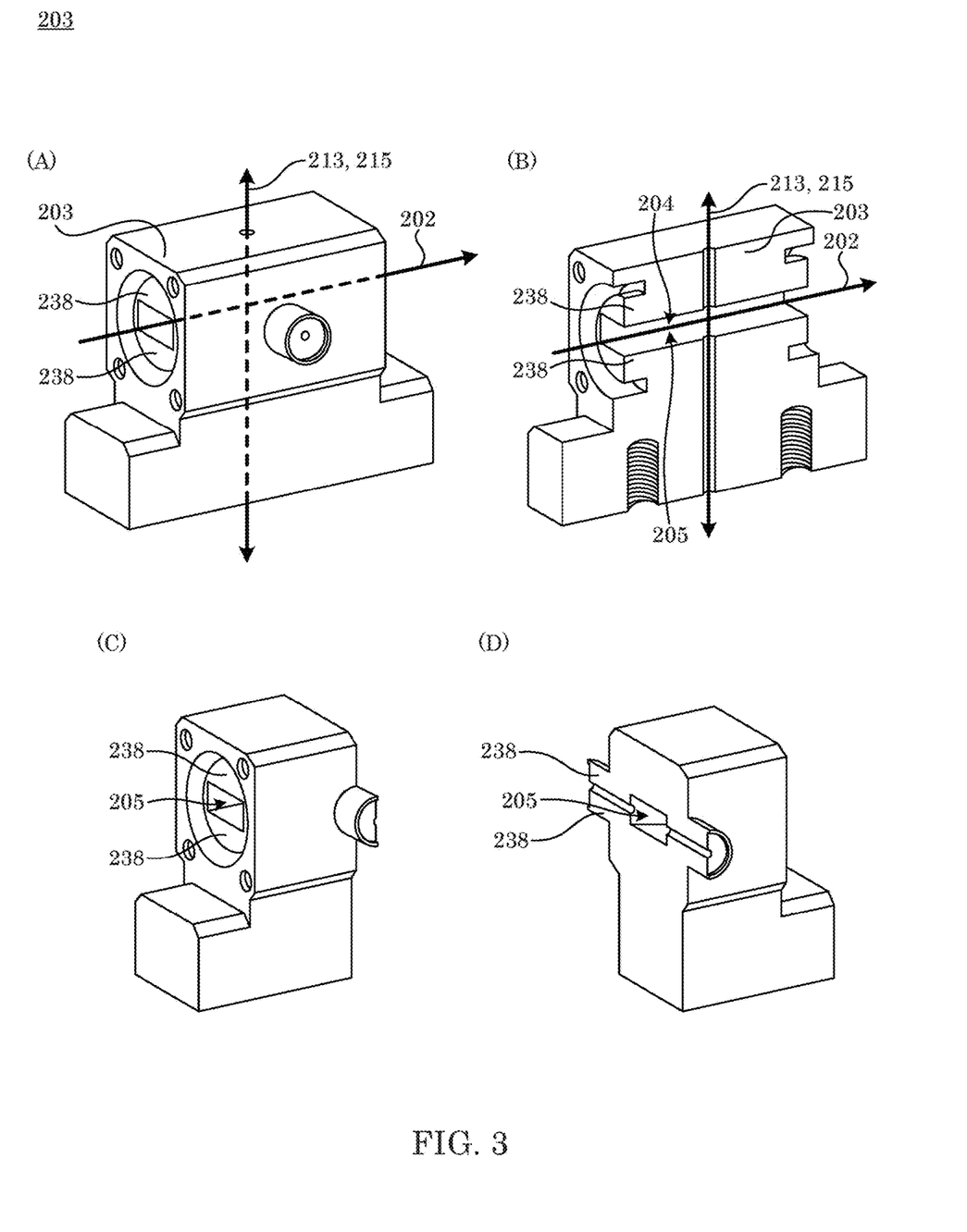
FIG. 3 shows a SI-traceable Rydberg atom radiofrequency power meter.
Figure 4:
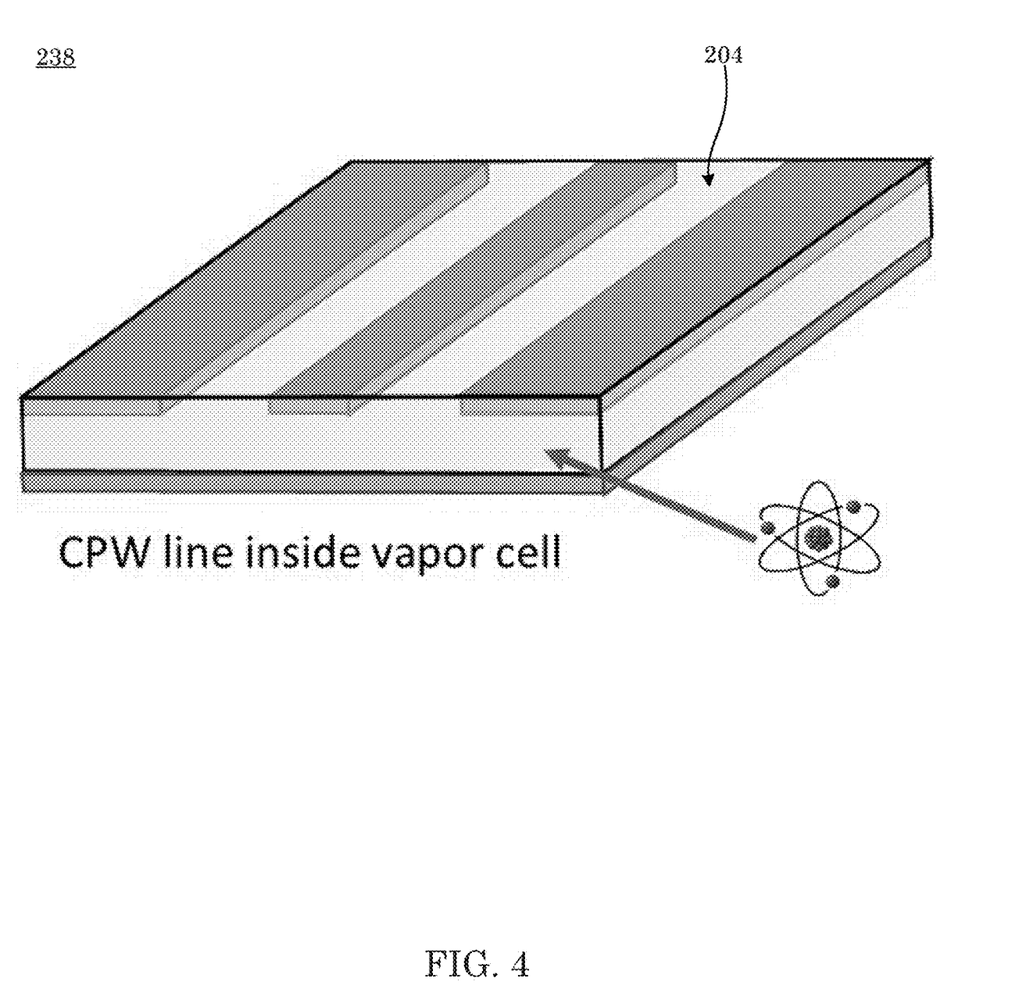
FIG. 4 shows a waveguide.

Radiofrequency source 201 provides radiofrequency signal 218 to interact with gas atoms 206. Radiofrequency source 201 can include an electromagnetic source to apply a signal to the atoms and can be applied via waveguiding devices such as shown in FIG. 2, FIG. 3, FIG. 3, and FIG. 4. Exemplary radiofrequency sources 201 include electromagnetic energy applied by various waveguiding devices and structures, e.g., as shown in FIG. 2, FIG. 3, and FIG. 4. In an embodiment, radiofrequency source 201 includes free-space sources and energy guided or confined in waveguiding devices and structures, e.g., as shown in FIG. 2, FIG. 3, and FIG. 4. Radiofrequency signal 218 can include a continuous wave signal, amplitude or frequency or polarization modulated signal, any type of continuous wave, any type of modulated signal, or any type of arbitrary waveform. Radiofrequency radiation 202 can include the electromagnetic wave for which the power is being measured. Exemplary reference radiofrequency radiation 202 include any type of electromagnetic wave. In an embodiment, radiofrequency radiation 202 includes any type of electromagnetic wave or energy which is to be detected or measured.

Radiofrequency signal 218 can be any type of electromagnetic wave or energy which is to be detected or measured.

Antenna 217 receives reference radiofrequency signal 218 and produces reference radiofrequency radiation 202 therefrom. Antenna 217 can include free-space sources and energy guided or confined in waveguiding devices and structures, e.g., as shown in FIG. 2, FIG. 3, and FIG. 4. Exemplary antennae 217 include those shown is FIG. 2, FIG. 3, and FIG. 4.

Probe laser 212 produces probe light 213 that interacts with gas atoms 206. Probe laser 212 can include any type of laser that can be tuned to a precise wavelength. Exemplary probe lasers 212 include laser tuned to the atomic transitions of an atomic species. In an embodiment, probe light 213 can have a wavelength that includes 850 nanometers or 780 nanometers. Exemplary probe light 213 include a frequency stabilized, and frequency tunable laser with controllable power output. Moreover, probe laser 212 and probe light 213 can be any laser and light source that allows for probing the atomic species used.

Coupling laser 214 produces coupling light 215 that interacts with gas atoms 206. Coupling laser 214 can include any type of laser that can be tuned to a precise wavelength. Exemplary coupling lasers 214 include a laser tuned to the atomic transitions of an atomic species. Coupling light 215 can include a 480 nanometers or 511 nanometers. Exemplary coupling light 215 include a frequency stabilized, and frequency tunable laser with controllable power output. Moreover, coupling laser 214 and coupling light 215 can be any laser and light source that allows for coupling various states of the atomic species used. In an embodiment, coupling light 215 includes lasers operating at 509 nm or 480 nm.

Probe light 213 and coupling light 215 optically overlap in optical overlap volume 216 through gas atoms 206 in vapor cell 203. It is contemplated that optical overlap volume 216 optical overlap volume 216 contains atoms of a choosing atomic specie. A volume of optical overlap volume 216 can be controlling the beam widths of light sources 213 and 215.

Probe light 213, coupling light 215, and radiofrequency radiation 202, can interact with gas atoms 206 to produce output light 209. Output light 209 can include spectra that is altered by 202. Exemplary output light 209 include a signal that can be used the detect and measured the electromagnetic power from 202. Moreover, output light 209 can be used to determine a SI-traceable measurements of the power carried by reference radiofrequency radiation 202.

SI-traceable Rydberg atom radiofrequency power meter 200 can include various optical, mechanical, and electrical components to interact with certain electric, optical, mechanical, and similar elements. Mirror 222 receives light (e.g., probe light 213, coupling light 215, output light 209) and reflects or partially transmits such light. Mirror 222.3 reflects 215 but transmits 213. Mirror 222.2 reflects 213 and can include a dichroic filter, a combination of high-pass and low-pass optical filters, and or polarization optical elements such as beam splitters and wave plates to separate 215 and 213.

Figure 5:
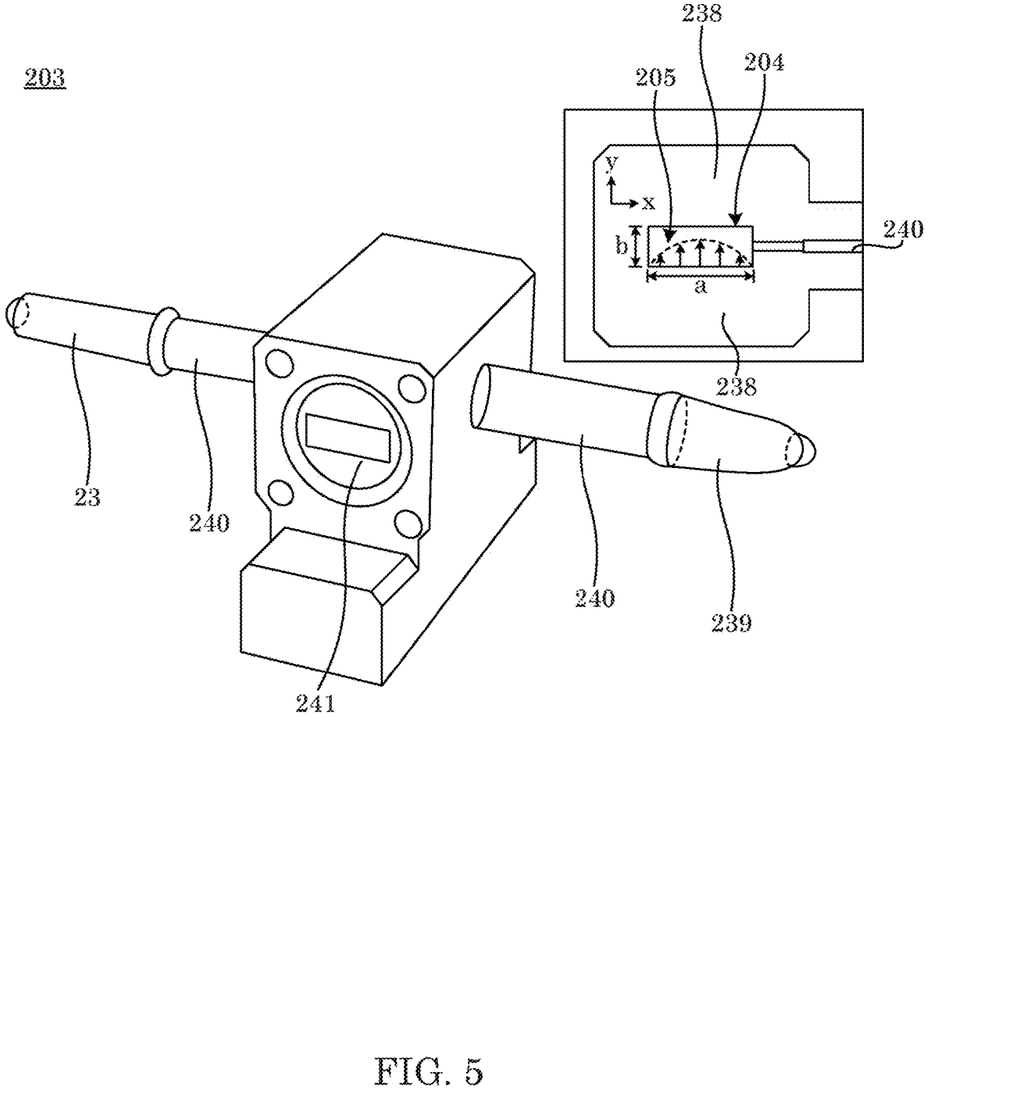
FIG. 5 shows a SI-traceable Rydberg atom radiofrequency power meter.

Input coupler 243 receives radiofrequency signal 218 and provides radiofrequency radiation 202 therefrom. Input coupler 243 can include a device that allows power to be coupled into or out of a waveguiding structure. Exemplary input couplers 243 include free-space, a mode coupler, rectangular waveguide (FIG. 2), or planar device (FIG. 5). Moreover, coupler allows for optical (probe light 213 and coupling light 215) light and radiofrequency (reference radiofrequency radiation 202) to be co-located in the location of the atomic vapor.

Directional coupler 242 communicates radiofrequency radiation 202. Directional coupler 242 can include a device that couples power into or out of a waveguiding structure. Exemplary directional couplers 242 include free-space, a mode coupler, rectangular waveguide (FIG. 2), or planar device (FIG. 5). Moreover, coupler allows for optical (probe light 213 and coupling light 215) light and radiofrequency (reference radiofrequency radiation 202) to be co-located in the location of the atomic vapor.

Power meter 244 measures a power of radiofrequency radiation 202 transmitted through vapor cell 203. Power meter 244 can include a device to measure power of radiofrequency radiation 202 and allows for a comparison to the power measured with the atomic vapor.

Radiofrequency tuner 245 tunes radiofrequency radiation 202. Radiofrequency tuner 245 can include a device that corrects perturbations in caused by the device that contains the atomic vapor (for example perturbation caused vapor cells shown in FIG. 3, FIG. 4, and FIG. 5).

With reference to FIG. 3 and FIG. 5, vapor cell 203 receives radiation, optical and otherwise, and contains gas atoms 206. Vapor cell 203 can include a device to contain the atomic species of choice. Exemplary vapor cells 203 include a rectangular waveguide (FIG. 3 and FIG. 5) with windows, a vapor cell placed inside a waveguide, or a planar waveguiding structure (FIG. 4). Moreover, the vapor cell can include any device that contains the atoms in order to fit into any structure for which power of reference radiofrequency radiation 202 can be measured. A shape of vapor cell 203, including a shape of vapor cell wall 204 that bounds vapor space 205 and contacts gas atoms 206 can be arbitrary and can be, e.g., a parallelepiped, cuboid, spherical, spheroidal (oblate or prolate), prismatic (e.g., pyramidal), and the like. Vapor cell 203 includes vapor space 205 bounded by vapor cell wall 204 that are opposing parallel surfaces of the pair of parallel-plate waveguides 238. Waveguides 238 can include a waveguide with glass windows and holes to allow for probe light 213 and coupling light 215 to be coupled into the waveguiding structure. The probe light 213 and coupling light 215 can propagate in the same direction as reference radiofrequency radiation 202 (as in FIG. 2), or probe light 213 and coupling light 215 can propagate orthogonal to the direction of propagation of reference radiofrequency radiation 202 (as in FIG. 3). In an embodiment, with reference to FIG. 4, waveguiding structures includes a planar waveguide structure (e.g., a co-planar waveguide and a microstrip). Gas tube 240 connects filling stem 239 to vapor space 205 for supplying gas atoms 206 to vapor space 205. Source of gas atoms 206 can be disposed in filling stem 239. Exemplary sources include alkali metals such as cesium, rubidium, and the like. Filling stem 239 can be selectively heated to change a vapor pressure of gas atoms 206. Optical window 241 can be disposed on vapor cell 203 proximate to parallel-plate waveguides 238 to seal gas atoms 206 in vapor space 205 and provide optical communication of probe light 213 and coupling light 215 and radiofrequency transmission of reference radiofrequency radiation 202.

Gas atoms 206 receive reference radiofrequency radiation 202, coupling light 215, and probe light 213 to undergo various electronic transitions. Gas atoms 206 include electronic energy levels shown in FIG. 6 that are electromagnetically accessed by reference radiofrequency radiation 202, coupling light 215, and probe light 213. Gas atoms 206 can include rubidium, cesium, or other atomic species. Exemplary gas atoms 206 include atomic species that are in gaseous state at room temperature for example isotopes of rubidium-87 and or rubidium-85 and or cesium-133. Moreover, energy (e.g., light or thermal energy) can be applied to ensure the atomic species are in gaseous state.

Gas atoms 206 convert radiation and light to output light 209 that is communicated from gas atoms 206 to transmission detector 210. Transmission detector 210 can include device to receive and detect 209 Exemplary transmission detectors 210 include a photodetector with enough bandwidth to detect the any modulation on output light 209. Moreover, transmission detector 210 can include a photodiode with variable gain to amplify output light 209 In an embodiment, transmission detector 210 includes a single photodiode or array of photodetectors. Transmission signal 211 is produced by transmission detector 210 from output light 209. Transmission signal 211 can include a device to receive and detect output light 209 Exemplary transmission signals 211 include a photodetector with bandwidth to detect the modulation on 209. Moreover, transmission signal 211 can include a device with variable gain to amplify output light 209.

SI-traceable Rydberg atom radiofrequency power meter 200 can be made in various ways. In an embodiment, a process for making SI-traceable Rydberg atom radiofrequency power meter 200 includes connecting reference radiofrequency source 201 and antenna 217; disposing antenna 217 in communication with gas atoms 206; disposing gas atoms 206 in vapor cell 203; disposing probe laser 212 in communication with vapor cell 203; disposing coupling laser 214 in communication with vapor cell 203; and disposing transmission detector 210 in communication with vapor cell 203.

The process for making SI-traceable Rydberg atom radiofrequency power meter 200 also can include a device in which Rydberg atoms detect and measure electromagnetic power.

SI-traceable Rydberg atom radiofrequency power meter 200 has numerous advantageous and unexpected benefits and uses. In an embodiment, a process for determining power of reference radiofrequency radiation 202 with the SI-traceable Rydberg atom radiofrequency power meter 200 includes: disposing gas atoms 206 in vapor space 205; receiving, by vapor cell 203, reference radiofrequency radiation 202; exciting gas atoms 206 to Rydberg electronic state 233; subjecting gas atoms 206 in Rydberg electronic state 233 to reference radiofrequency radiation 202; producing output light 209 by gas atoms 206 in response to being subjected to reference radiofrequency radiation 202 while in Rydberg electronic state 233; receiving, by transmission detector 210, output light 209 from vapor cell 203; producing, by transmission detector 210, transmission signal 211; and determining power of modulated carrier radiation 208 from transmission signal 211, such that the determination of power is traceable to the International System of Units (SI).

The process for determining power of reference radiofrequency radiation 202 also can include: producing probe light 213 that includes probe frequency that is resonant with probe electronic transition 229 of gas atoms 206; producing coupling light 215 that includes coupling frequency that is resonant with Rydberg electronic transition 232 of gas atoms 206, receiving, by gas atoms 206, probe light 213, coupling light 215, and reference radiofrequency radiation 202; subjecting gas atoms 206 to probe light 213; undergoing, by gas atoms 206, probe electronic transition 229 from first electronic state 230 to intermediate excited electronic state 231 in response to receiving probe light 213; subjecting gas atoms 206 in intermediate excited electronic state 231 to coupling light 215; undergoing, by gas atoms 206 in intermediate excited electronic state 231, Rydberg electronic transition 232 from intermediate excited electronic state 231 to Rydberg electronic state 233 in response to receiving coupling light 215; subjecting gas atoms 206 in Rydberg electronic state 233 to reference radiofrequency radiation 202; and undergoing, by gas atoms 206 in Rydberg electronic state 233, radiofrequency Rydberg transition 234 from Rydberg electronic state 233 to final Rydberg electronic state 235 in response to receiving reference radiofrequency radiation 202.

SI-traceable Rydberg atom radiofrequency power meter 200 and processes disclosed herein have numerous beneficial uses, including low absorption of radiofrequency power and thus minimal invasive measurement of radio frequency power, SI traceability, power measurement linked to atomic measurements, large frequency of operation including above 110 GHz. Advantageously, SI-traceable Rydberg atom radiofrequency power meter 200 overcomes limitations of technical deficiencies of conventional compositions such as providing SI-traceable radiofrequency power measurements above 110 GHz, and overcoming conventional approaches that involve thermal detectors to measure radiofrequency power.

The articles and processes herein are illustrated further by the following Example, which is non-limiting.

EXAMPLES

Example

A quantum-based power standard: Using Rydberg atoms for a SI-traceable radio-frequency power measurement technique in rectangular waveguides The Example describes determining radio-frequency (RF) power using electromagnetically induced transparency (EIT) in a Rydberg atomic vapor. This is accomplished by placing alkali atomic vapor in a rectangular waveguide and measuring the electric (E) field strength (utilizing EIT and Autler-Townes splitting) for a wave propagating down the waveguide. The RF power carried by the wave is then related to this measured E-field, which leads to a direct International System of Units measurement of RF power. To demonstrate this approach, we first measure the field distribution of the fundamental mode in the waveguide and then determine the power carried by the wave at both 19.629 GHz and 26.526 GHz from the measured E-field.

The world of measurement science is changing rapidly due to the International System of Units (SI) redefinition planned for late 2018. As a result of the shift towards fundamental physical constants, the role of primary standards must change. This includes radio-frequency (RF) power. The current method of power traceability is typically based on an indirect path through a thermal measurement using a calorimeter, in which temperature rise created by absorbed microwave energy is compared to the DC electrical power. A direct SI-traceable measurement of RF power is desired and to accomplish this we will utilize recent work on electric (E) field metrology using Rydberg atomic vapor.

It can be shown that the E-field of the fundamental mode [the transverse electric ($TE_{10}$) mode] in the rectangular waveguide, shown in FIG. 5, is given by $$E = E0\ \sin(\pi a x) a y E = E0\ \sin(\pi a x) a y \quad (1)$$

and the power carried by this mode is $$P = E20 ab 4\epsilon 0 \mu 0 \sqrt{1 - (c2af)2} \sqrt{,} P = E02 ab 4\epsilon 0 \mu 0 1 - (c2af)\ 2, \quad (2)$$

where $E_0$ is the amplitude of the E-field at the center of the waveguide, a and b are the cross-sectional dimensions of the rectangular waveguide (where a is the larger dimension, see the inset in FIG. 5), f is the frequency, $\epsilon_0$ and $\mu_0$ are the permittivity and permeability of free space, and c is the speed of light in vacuo. In FIG. 5, a WR-42 rectangular waveguide vapor cell has waveguide dimensions, wherein the vapor cell includes of a 34-mm section of waveguide with glass windows attached to each end (and filled with $^{133}$Cs).

If $E_0$ can be measured, then the power can be determined. For the atom-based, SI-traceable measuring of E-field strengths with Rydberg-atom spectroscopic approach for RF E-field strength measurements, we used electromagnetically induced transparency (EIT) and Autler-Townes (AT) splitting for a direct SI traceable, self-calibrated measurement.

Figure 6:
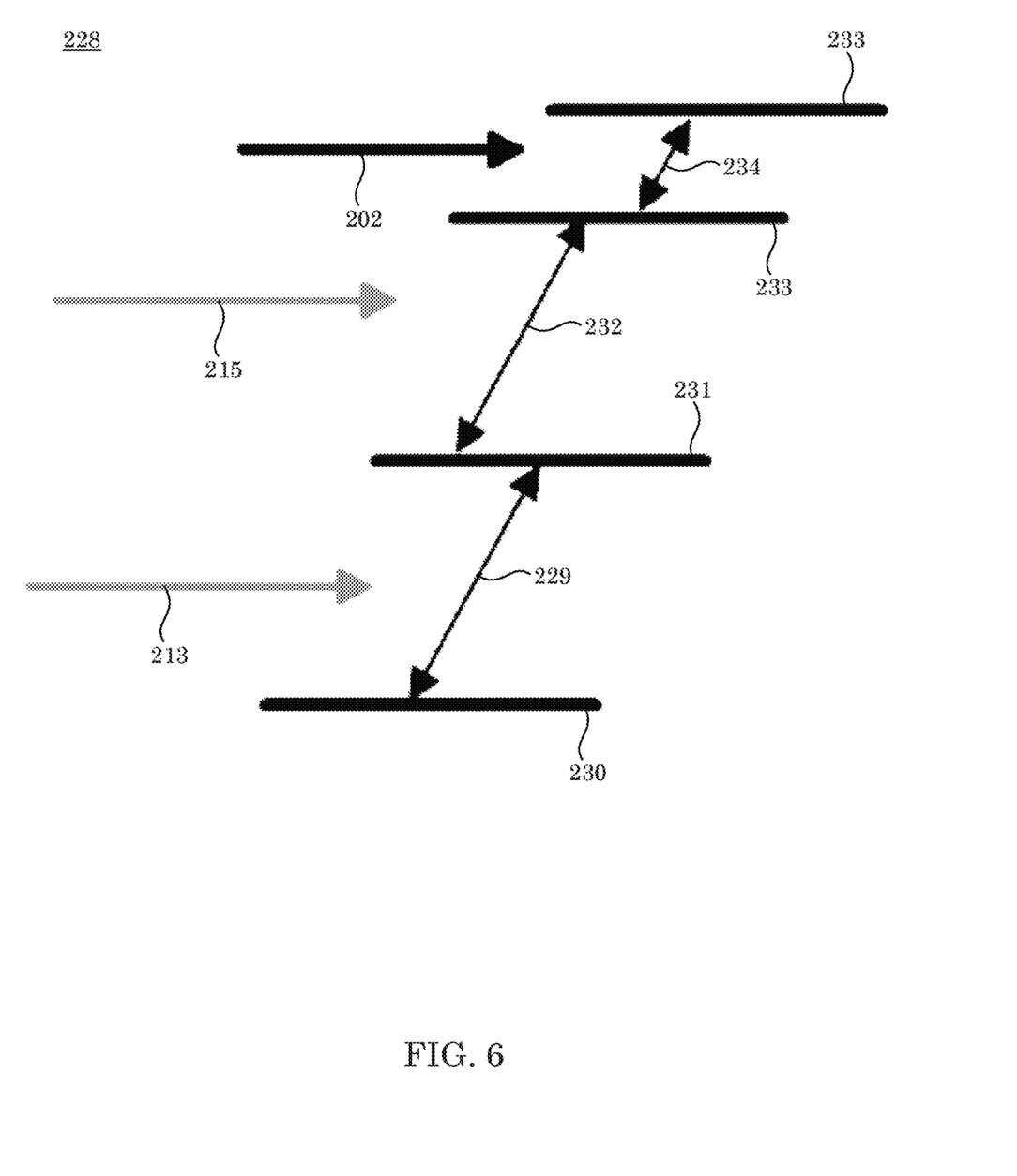
FIG. 6 shows Rydberg transitions 228.

With regard to E-field measurement, consider a sample of stationary four-level atoms illuminated by a single weak ("probe") light field, as depicted in FIG. 6. In this approach, one laser is used to probe the response of the atoms and a second laser is used to couple to a Rydberg state (the "coupling" laser). In the presence of the coupling laser, the atoms become transparent to the probe laser transmission (this is the concept of EIT). The coupling laser wavelength is chosen such that the atom is in a sufficiently high state (a Rydberg state) such that a radio frequency (RF) field coherently couples two Rydberg states (levels 3 and 4 in FIG. 6). The RF transition in this four-level atomic system causes a splitting of the transmission spectrum (the EIT signal) for a probe laser. This splitting of the probe laser spectrum is easily measured and is directly proportional to the applied RF E-field amplitude (through Planck's constant and the dipole moment of the atom). By measuring this splitting ($\Delta f_m$), we can obtain a direct measurement of the magnitude of the RF E-field strength for a time-harmonic field as $$|E|=2\pi\hbar\rho\Delta f m, \quad (3)$$

where $\hbar$ is Planck's constant, $\rho$ is the atomic dipole moment of the RF transition, and $\Delta f_m$ is the measured splitting when the coupling laser is scanned. If the probe laser is scanned, a Doppler mismatch correction is involved in this expression. We consider this type of measurement of the E-field strength a direct, SI-traceable, self-calibrated measurement in that it is related to Planck's constant (which will become a SI quantity defined by standard bodies in the near future) and only requires a frequency measurement ($\Delta f_m$, which can be measured very accurately and is calibrated to the hyperfine atomic structure). FIG. 6 shows a four-level system for measuring EIT with the counter-propagating probe and coupling beams.

Figure 7:
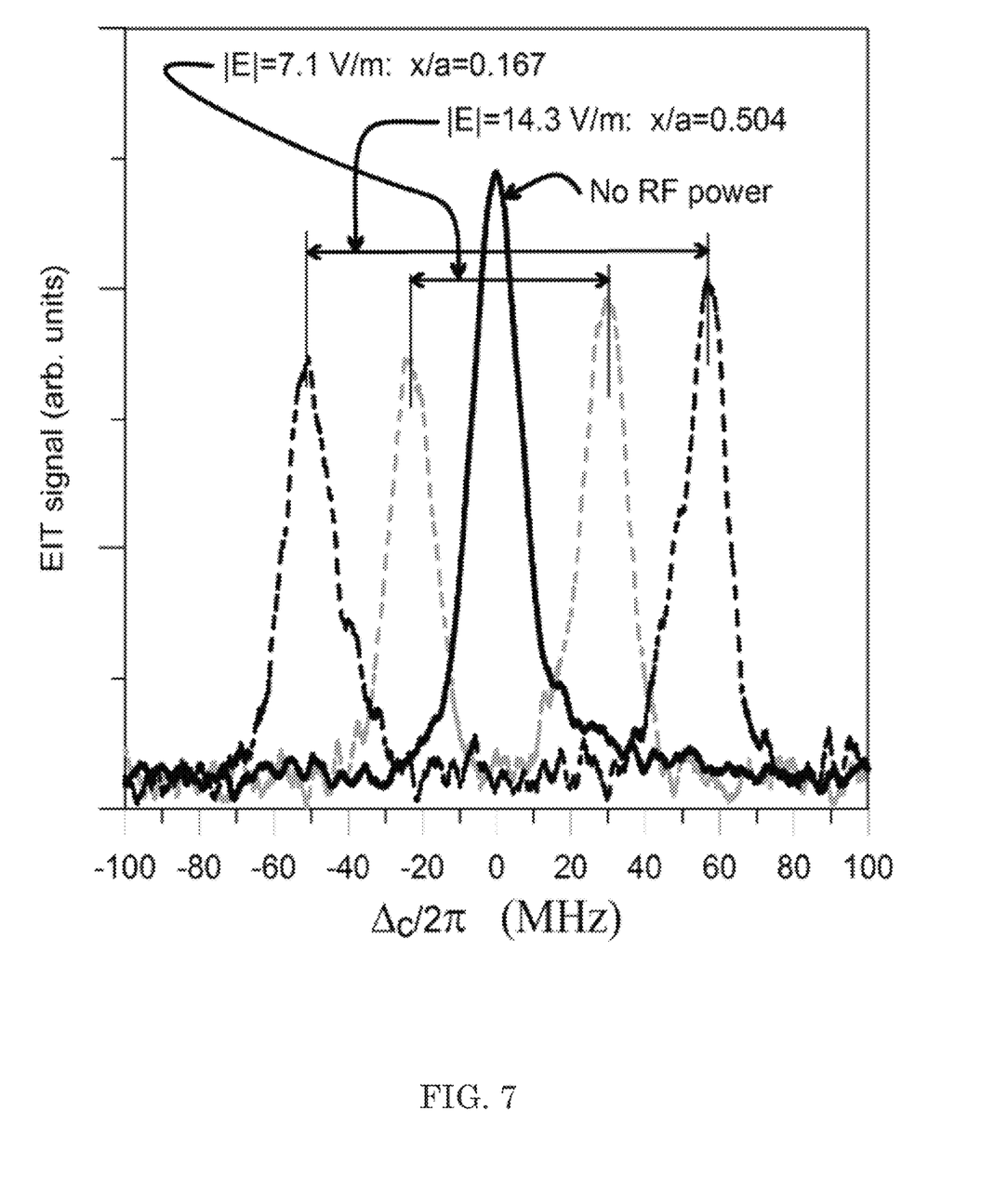
FIG. 7 shows EIT signal (i.e., probe laser transmission through the cell) as a function of coupling laser detuning $\Delta_c$. This dataset is for 19.629 GHz and corresponds to this following 4-level atomic system: 61/2-6P3/2-34D5/2-35P3/261/2-6P3/2-34D5/2-35P312. The dashed curves correspond to two different x-locations across the WR42 waveguide for an input power of −20.76 dBm.

A measured spectrum for an RF source with different E-field strengths is shown in FIG. 7. This figure shows the measured EIT signal for two E-field strengths (more details on these results are given below). In this figure, $\Delta_c$ is the detuning of the coupling laser (where $\Delta_c=\omega_c-\omega_o$; $\omega_o$ is the on-resonance angular frequency of the Rydberg state transition and $a_k$ is the angular frequency of the coupling laser). Notice that the AT splitting increases with increasing applied E-field strength. To obtain these results, we use cesium atoms ($^{133}$Cs) and the levels |1>, |2>, |3>, and |4> correspond, respectively, to the $^{133}$Cs $6S_{1/2}$ ground state, $6P_{3/2}$ excited state, and two Rydberg states. The probe is locked to the D2 transition (a 852 nm laser). The probe beam is focused to a full-width at half maximum (FWHM) of 290 μm, with a power of 3.2 μW. To produce an EIT signal, we apply a counter-propagating coupling laser (wavelength $\lambda_c \approx 510$ nm) with a power of 17.3 mW, focused to a FWHM of 380 μm. The coupling laser was scanned across the $6P_{3/2}$–$34D_{5/2}$ Rydberg transition ($\lambda_c=511.1480$ nm). We modulate the coupling laser amplitude with a 30 kHz square wave and detect any resulting modulation of the probe transmission with a lock-in amplifier. This removes the Doppler background and isolates the EIT signal, as shown in the solid curve of FIG. 7. Application of RF (details below) at 19.629 GHz to couple states $34D_{5/2}$ and $35P_{3/2}$ splits the EIT peak as shown in the dashed curves in the figure. The asymmetry in the EIT signal amplitude in the presence of the RF field is most likely due to Stark shifts. These small amounts of asymmetries do not affect the ability to use Eq. (3) to obtain accurate E-field strengths for low to moderate values. These asymmetries can also arise for RF detuning to ensure the RF signal is on resonance for the Rydberg states |3> and |4>. We measure the frequency splitting of the EIT peaks in the probe spectrum and determine the E-field amplitude using (3) as shown in FIG. 7. For this measurement, the dipole moment for the resonant RF transition is $\rho=723.393ea_0$ (which includes a radial part of $1476.619ea_0$ and an angular part of 0.48989, which correspond to colinear polarized optical and RF fields, where e is the elementary charge, and $a_0=0.529177\times10^{-10}$ m is the Bohr radius.

Calculating $\rho$ involves numerically solving the Schrödinger equation for the atomic wavefunctions and then a numerical evaluation of the radial overlap integrals involving the wavefunctions for a set of atomic states. For a given atomic state, these numerical calculations require one to use the quantum defects (along with the Rydberg formula) for the alkali atom of interest. Using the best available quantum defects to perform a numerical calculation of $\rho$, it is believed that $\rho$ can be determined to less than 0.1%, which has been verified experimentally.

In order to measure the power propagating down a WR42 rectangular waveguide, we placed a $^{133}$Cs vapor cell in the waveguide system shown in FIG. 2. The experimental setup includes two 10 dB directional couplers, two RF tuners, and a 34 mm section of waveguide that serves as the vapor cell. The vapor cell consists of a 34-mm length of WR42 stainless-steel waveguide with glass windows attached to each end (attached with vacuum epoxy), see FIG. 5 and FIG. 2. The glass windows allow the vapor-cell waveguide to be filled with $^{133}$Cs under vacuum. The directional couplers were used to allow the probe and coupling laser to propagate down the waveguide system and interact with the $^{133}$Cs vapor, while at the same time allowing RF power to be coupled into the waveguide system (the directional coupler on the left) and allowing RF power to be coupled out of the waveguide system (the directional coupler on the right). The output of this second directional coupler was attached to a conventional RF power meter. The presence of the two windows on the vapor cell results in the possibility of RF standing waves (SWs) inside the vapor-cell along the propagation direction (along the waveguide axis). The RF tuners are used to minimize and eliminate these standing waves (discussed below). The RF energy path is as follows: the output of a RF signal generator is connected to the directional coupler on the left of FIG. 2 (labeled as the RF input). After propagating through this directional coupler and the first RF tuner, it passes through the vapor cell (34-mm sectional of waveguide containing $^{133}$Cs) where it is measured using the EIT/AT approach. RF energy then propagates through the second RF tuner and into the last directional coupler. The curved section of this last directional coupler picks off about −10 dB (−10.44 dB at 19.629 GHz, and −9.88 dB at 26.562 GHz) of the input power and is then terminated into a power meter, see FIG. 2. The remaining power, that is not coupled into the power meter, propagates down the straight section of the directional coupler and radiates out of the end of the directional coupler. The RF absorber is placed 30 cm in front of the open-ended directional coupler (the absorber is used to absorb the radiated power in order to ensure that this radiated power is not reflected back into the coupler). Note that the coupler is left open in order to allow both the probe and coupling lasers to enter the waveguide setup and interact with the vapor cell section of the waveguide. While most of the power is radiated out of the coupler, there is some small faction of power reflected at the open-ended coupler, and this reflected power propagates back through the tuner and toward the vapor cell. As discussed below, the tuners are used to minimize any standing waves caused by these possible reflections.

Figure 8:
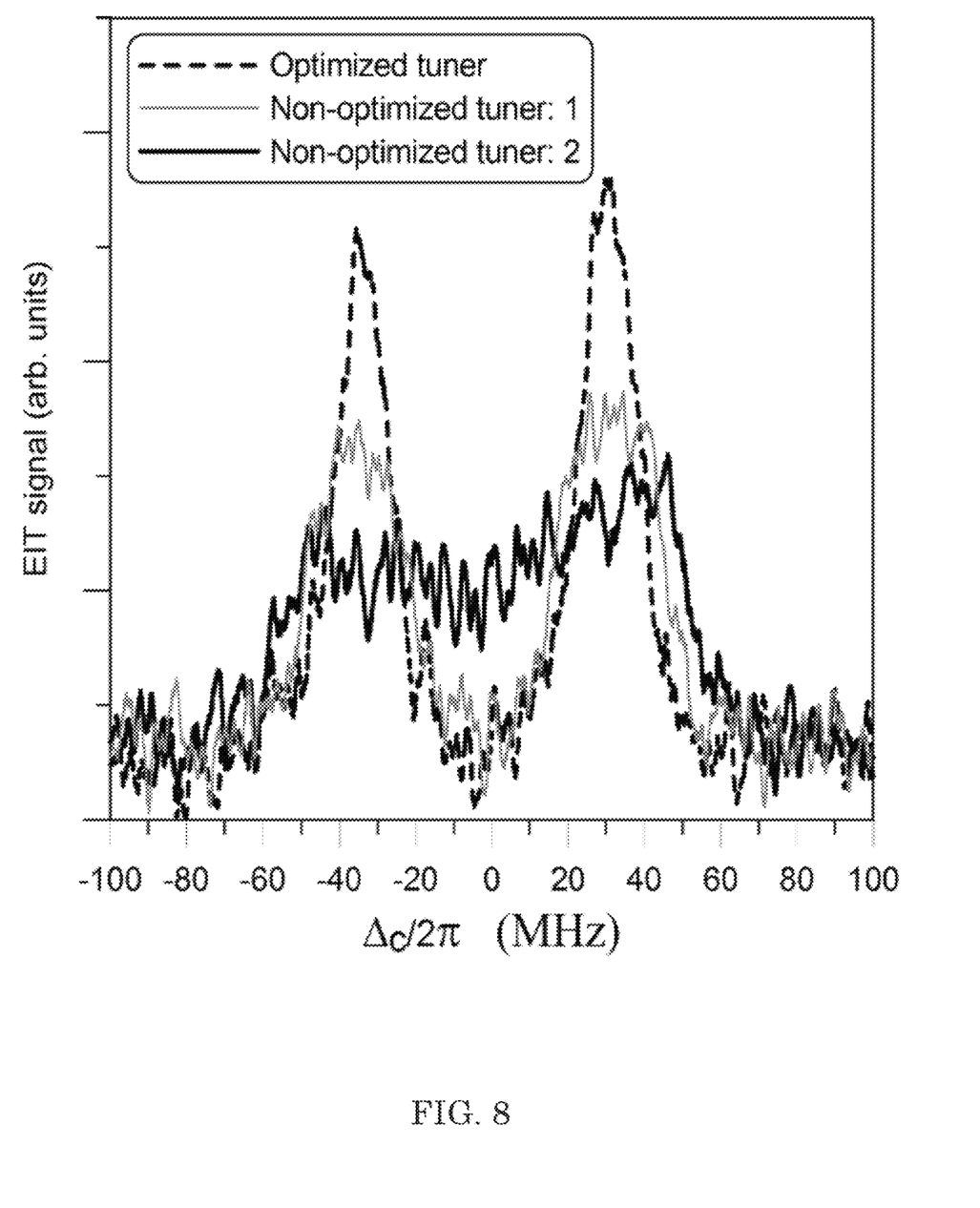
FIG. 8 shows effects of the standing waves (inhomogeneous field) on the EIT line width. These results are for x/a=0.5, 19.629 GHz, and an input power of −24.79 dBm.

The WR42 waveguide system has dimensions of a=10.668 mm and b=4.318 mm which allows for only one propagating mode (the fundamental $TE_{10}$ mode) between 18 GHz and 27 GHz. Thus, we perform experiments for two frequencies in this range, i.e., 19.629 GHz and 26.526 GHz. We first perform experiments at 19.629 GHz which correspond to the 6S1/2-6P3/2-34D5/2-35P3/2 atomic system. The waveguiding system was placed on a translation-stage, which allowed the probe and coupling lasers to be scanned (while maintaining their counter-propagation alignment) across the x-axis of the waveguide. The EIT signal at two different x-axis locations in the waveguide is shown in FIG. 7. These results are for an input power (input to the directional coupler on the left, see FIG. 2) of −20.76 dBm. As discussed above, the presence of the glass windows can result in possible standing waves inside the vapor-cell. In order to get an accurate measurement for the forward propagating power, these standing waves needed to be eliminated (or at least minimized as much as possible). We can use the linewidth of the EIT signal as a means of determining when the standing wave (SW) effect is minimized. The SWs can result in a broadening of the EIT linewidth, a direct result of the inhomogeneous E-field variation (due to the SWs) along the propagation direction. An inhomogeneous E-field along the direction of the laser beam propagation can cause a broadening of the EIT linewidth. To minimize this effect, we varied the RF tuners on both sides of the vapor-cell waveguide until the EIT linewidth was minimized, which was an indication when the RF SWs in the vapor-cell were minimized. The effect of the SWs on the EIT linewidth is shown in FIG. 8, where we show three EIT signals. One of the EIT signals is for the case when the RF tuners are optimized and the other two EIT signals are for the case when the RF tuners are non-optimized. We see that the EIT linewidth for the non-optimized cases is larger than the optimized case. Furthermore, the EIT signal shown in FIG. 7 is for the optimized tuners and we see that for this optimized case, the EIT linewidth is approximately the same as the case with no RF power in the waveguide, indicating that the RF SWs in the waveguide are minimized.

Figure 9:
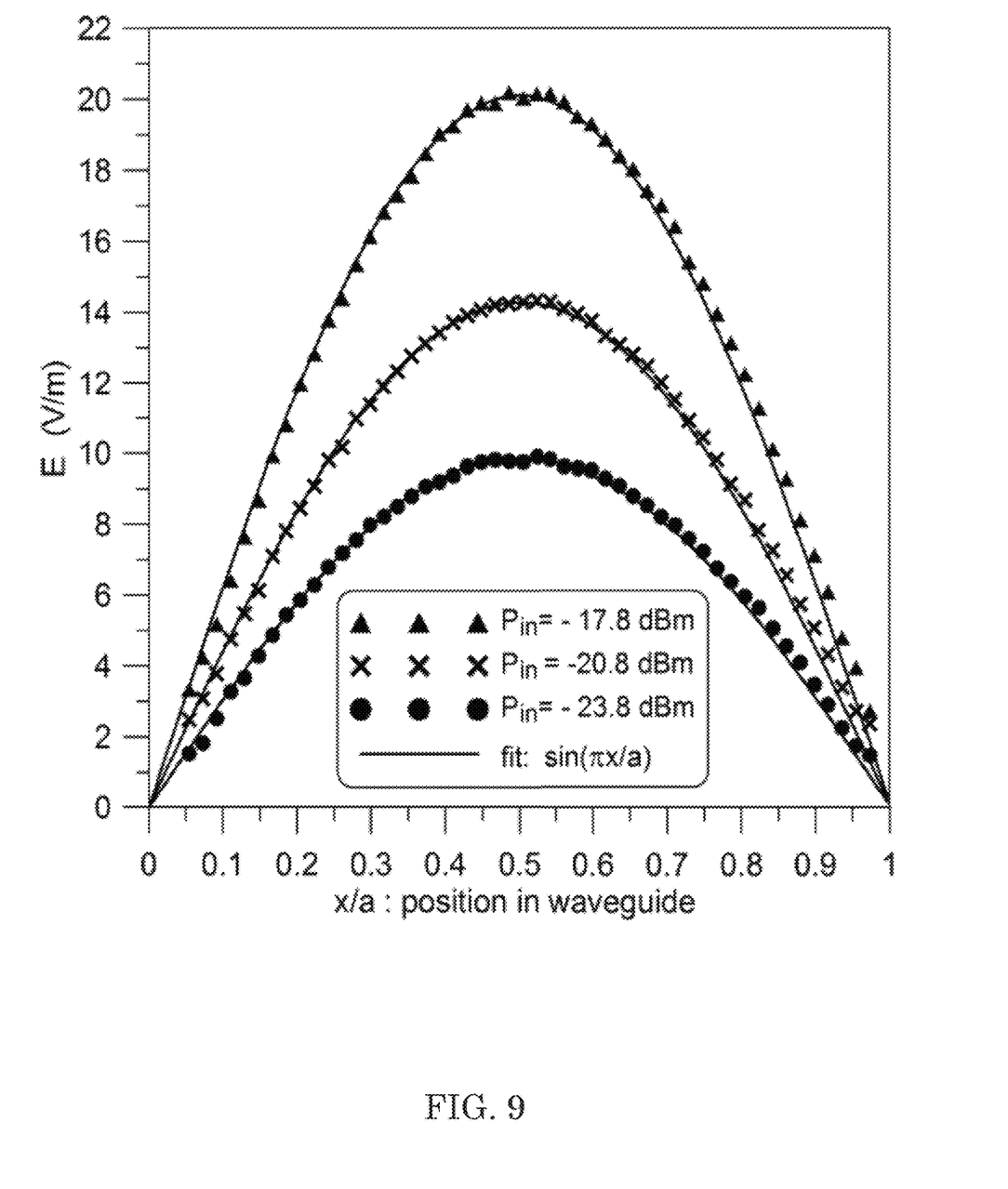
FIG. 9 shows an E-field distribution along the x-axis of the waveguide at 19.629 GHz.

We measured the E-field distribution across the x-axis in the waveguide for different input RF power levels. This is done by scanning the laser across the x-axis of the waveguide from x=0 to x=α (actually scanning the waveguide system via the translation stage). The measured E-field distributions inside the waveguide for three different input powers (input to the directional coupler) are shown in FIG. 9. To obtain the results, we first measured $\Delta f_m$ of the EIT signal at different x locations, then using Eq. (3), the E-field strength was determined. As indicated from Eq. (1), the E-field dependence should follow a sin (πx/a)sin (πx/a) distribution for the $TE_{10}$ mode. The results in this figure indicate that the measured E-field distribution inside the waveguide follows this behavior very well.

Figure 10:
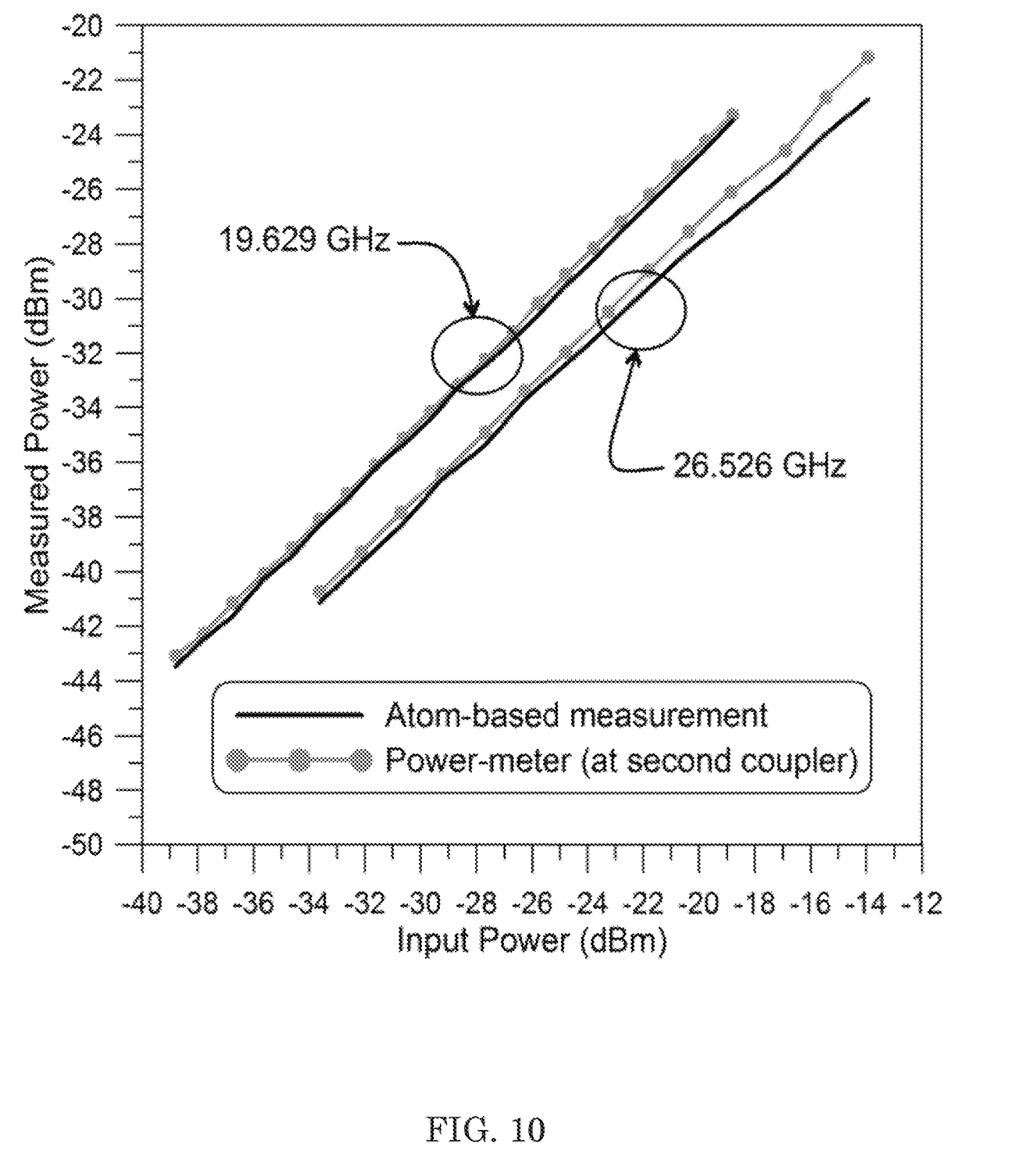
FIG. 10 shows measurements of power in the waveguide versus input power at both 19.629 GHz and 26.526 GHz.

With the E-field strength determined at the center of the waveguide (i.e., x=α/2), Eq. (2) can be used to determine the power flowing down the waveguide system. FIG. 10 shows the measured RF power in the waveguide as a function of input power (i.e., the input power at the directional coupler on the left). These results are at 19.629 GHz and for a 4-level atomic system (6S1/2-6P3/2-34D5/2-35P3/2) and with the same probe and coupling laser bandwidth and powers as that used above. As a comparison, we also show results obtained from a conventional power meter connected to the right directional coupler. The power-meter results were corrected for the losses in the waveguide system (i.e., loss and directional coupler attenuation). The comparison shows a very good agreement.

We performed a second set of measurements at 26.526 GHz. These experiments correspond to the following 4-level atomic system: 6S1/2-6P3/2-31D5/2-32P3/2. Once again the probe laser was locked to the D2 $^{133}$Cs transient (a 852 nm laser) and the coupling laser was scanned across the $6P_{3/2}$–$31D_{5/2}$ Rydberg transition ($\lambda_c$=511.787 nm). The power and beamwidth for probe and coupling lasers were the same as used for 19.629 GHz. We first measured the E-field along the x-axis for the waveguide. While the results are not shown here, the results are similar to those for the 19.629 GHz case, i.e., following the expected sin (πx/a)sin (πx/a) behavior. With the E-field strength determined [using ρ=592.158ea0 (which includes a radial part of 1208.737e$a_0$ and an angular part of 0.48989)] in the center of the waveguide (i.e., x=α/2), Eq. (2) can be used to determine the power flowing down the waveguide system. FIG. 10 shows the measured RF power in the waveguide as a function of input power (i.e., the input power at the directional coupler on the left). Also, shown are the results from a conventional power-meter, where we see some discrepancies at the higher powers level for 26.526 GHz. Nevertheless, these results illustrate the ability to use Rydberg atoms to obtain the RF power inside a waveguide, which can lead to a SI-traceable method for determining RF power.

When the RF field levels become high (and stray electric and/or magnetic fields are present), one has to modify the approach for determining the E-field strength. Under these conditions, Eq. (3) is no longer valid and one needs to use a more elaborate model involving a Floquet analysis. In this approach, Stark maps from the Floquet model are fitted to measured Stark maps to determine the field strength. This type of a approach had been used in the past with great success for high E-field strength measurements and off-resonant fields.

For a quantum-based power standard, the SI-traceable Rydberg atom radiofrequency power meter presented here provides an SI-traceable measurement of RF power. The process includes Rydberg atomic vapor placed in rectangular waveguide and utilizing the EIT/AT approach. We demonstrated the ability to measure the E-field distribution of the fundamental $TE_{10}$ mode in the waveguide. We performed measurements of RF power from the Rydberg-atom approach and compared it to results obtained from a conventional power meter. Results demonstrated measurement of RF power inside a waveguide and direct SI-traceable approach for power metrology. When compared to conventional power metrology approaches, the SI-traceable Rydberg atom radiofrequency power meter is a direct SI traceable approach, has lower uncertainty, exhibits better frequency range, and has better dynamic range (i.e., power-level ranges) than conventional devices and conventional methods.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Optional or optionally means that the subsequently described event or circumstance can or cannot occur, and that the description includes instances where the event occurs and instances where it does not. As used herein, combination is inclusive of blends, mixtures, alloys, reaction products, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms a and an and the and similar referents in the context of describing the invention (especially in the context of the following claims) are to be construed to cover both the singular and the plural, unless otherwise indicated herein or clearly contradicted by context. Or means and/or. It can further be noted that the terms first, second, primary, secondary, and the like herein do not denote any order, quantity, or importance, but rather are used to distinguish one element from another. The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. An SI-traceable Rydberg atom radiofrequency power meter for determining power of reference radiofrequency radiation comprising:
    a reference radiofrequency source that provides reference radiofrequency radiation;
    a vapor cell in communication with the reference radiofrequency source and comprising:
        a radiofrequency waveguide comprising a vapor cell wall and a vapor space bounded by the vapor cell wall of the radiofrequency waveguide, such that the radiofrequency waveguide propagates the reference radiofrequency radiation through the vapor space;
        the vapor cell wall comprising faces of the radiofrequency waveguide that are exposed to gas atoms disposed in the vapor space; and
        the vapor space physically bounded by the vapor cell wall to contain gas atoms in an optical overlap volume, such that the vapor cell:
            receives gas atoms in the vapor space;
            receives the reference radiofrequency radiation, such that the gas atoms are subjected to the reference radiofrequency radiation in the vapor space of the radiofrequency waveguide; and
            produces output light by the gas atoms in response to subjecting the gas atoms to the reference radiofrequency radiation, probe light, and coupling light; and
    a transmission detector that receives the output light from the vapor cell and produces a transmission signal from the transmission detector for determination of power of the reference radiofrequency radiation,
    wherein the SI-traceable Rydberg atom radiofrequency power meter determines power of the reference radiofrequency radiation by electromagnetically induced transparency of the gas atoms in a Rydberg electronic state, the determination of power being traceable to the International System of Units (SI).

2. The SI-traceable Rydberg atom radiofrequency power meter of claim 1, further comprising:
    a probe laser that produces probe light that comprises a probe frequency that is resonant with a probe electronic transition of the gas atoms; and
    a coupling laser that produces coupling light that comprises a coupling frequency that is resonant with a Rydberg electronic transition of the gas atoms,
    wherein the vapor cell further:
        receives the probe light from the probe laser, the coupling light from the coupling laser, and the reference radiofrequency radiation; and
        subjects the gas atoms to the probe light, and the gas atoms undergo a probe electronic transition from a first electronic state to an intermediate excited electronic state in response to receiving the probe light;
        subjects the gas atoms in the intermediate excited electronic state to the coupling light, and the gas atoms in the intermediate excited electronic state undergo a Rydberg electronic transition from the intermediate excited electronic state to a Rydberg electronic state in response to receiving the coupling light; and
        subjects the gas atoms in the Rydberg electronic state to the reference radiofrequency radiation, and the gas atoms in the Rydberg electronic state undergo a radiofrequency Rydberg transition from the Rydberg electronic state to a final Rydberg electronic state in response to receiving the reference radiofrequency radiation.

3. The SI-traceable Rydberg atom radiofrequency power meter of claim 2, further comprising:
    an antenna in communication with the reference radiofrequency source and that receives a reference radiofrequency signal from the reference radiofrequency source and produces the reference radiofrequency radiation from the reference radiofrequency signal;
    wherein the gas atoms receive the reference radiofrequency radiation from the antenna.

4. The SI-traceable Rydberg atom radiofrequency power meter of claim 3, further comprising:
    a position manipulation stage on which the antenna is disposed and that moves the antenna along a movement direction relative to the vapor cell to change a pathlength between the antenna and the vapor cell through which the reference radiofrequency radiation propagates.

5. The SI-traceable Rydberg atom radiofrequency power meter of claim 2, further comprising:

a radiofrequency tuner disposed on the vapor cell in radiocommunication with the radiofrequency waveguide and that receives and tunes the reference radiofrequency radiation.

6. The SI-traceable Rydberg atom radiofrequency power meter of claim 2, further comprising:
a power meter disposed in radiocommunication with the radiofrequency waveguide and that receives tunes the reference radiofrequency radiation after propagating through the vapor cell.

7. The SI-traceable Rydberg atom radiofrequency power meter of claim 2, further comprising:
a directional coupler disposed on the vapor cell in radiocommunication with the parallel-plate waveguides and that receives the reference radiofrequency radiation couples the reference radiofrequency radiation with the radiofrequency waveguide.

8. The SI-traceable Rydberg atom radiofrequency power meter of claim 2, further comprising:
an input coupler disposed on the vapor cell in radiocommunication with the radiofrequency waveguide and that receives the reference radiofrequency radiation and communicates the reference radiofrequency radiation to the vapor cell.

9. The SI-traceable Rydberg atom radiofrequency power meter of claim 2, wherein the vapor cell further comprises:
a gas tube in fluid communication with the vapor space and that communicates the gas atoms to the to the vapor space; and
a filling stem in fluid communication with the vapor space and the gas tube and that communicates the gas atoms to the to the vapor space through the gas tube and contains alkali metal for production of the gas atoms from the alkali metal.

10. The SI-traceable Rydberg atom radiofrequency power meter of claim 2, wherein the vapor cell further comprises:
an optical window in fluid communication with the vapor space and that communicates the probe light and the coupling light to the vapor space.

11. A process for determining power of reference radiofrequency radiation with the SI-traceable Rydberg atom radiofrequency power meter of claim 1, the process comprising:
disposing gas atoms in the vapor space of the radiofrequency waveguide;
receiving, by the vapor cell, the reference radiofrequency radiation;
exciting the gas atoms to a Rydberg electronic state;
subjecting the gas atoms in the Rydberg electronic state to the reference radiofrequency radiation;
producing output light by the gas atoms in response to being subjected to the reference radiofrequency radiation while in the Rydberg electronic state;
receiving, by the transmission detector, the output light from the vapor cell;
producing, by the transmission detector, the transmission signal; and
determining power of the modulated carrier radiation from the transmission signal, such that the determination of power of the reference radiofrequency radiation is traceable to the International System of Units (SI).

12. The process for determining power of reference radiofrequency radiation of claim 11, further comprising:
producing probe light that comprises a probe frequency that is resonant with a probe electronic transition of the gas atoms;
producing coupling light that comprises a coupling frequency that is resonant with a Rydberg electronic transition of the gas atoms,
receiving, by the gas atoms, the probe light, the coupling light, and the reference radiofrequency radiation;
subjecting the gas atoms to the probe light;
undergoing, by the gas atoms, a probe electronic transition from a first electronic state to an intermediate excited electronic state in response to receiving the probe light;
subjecting the gas atoms in the intermediate excited electronic state to the coupling light;
undergoing, by the gas atoms in the intermediate excited electronic state, a Rydberg electronic transition from the intermediate excited electronic state to a Rydberg electronic state in response to receiving the coupling light;
subjecting the gas atoms in the Rydberg electronic state to the reference radiofrequency radiation; and
undergoing, by the gas atoms in the Rydberg electronic state, a radiofrequency Rydberg transition from the Rydberg electronic state to a final Rydberg electronic state in response to receiving the reference radiofrequency radiation.

13. The process for determining power of reference radiofrequency radiation of claim 12, further comprising:
receiving, by an antenna, a reference radiofrequency signal from the reference radiofrequency source;
producing the reference radiofrequency radiation from the reference radiofrequency signal; and
receiving, by the gas atoms, the reference radiofrequency radiation from the antenna.

14. The process for determining power of reference radiofrequency radiation of claim 12, further comprising:
moving the antenna along a movement direction relative to the vapor cell; and
changing a pathlength between the antenna and the vapor cell through which the reference radiofrequency radiation propagates.

* * * * *